United States Patent [19]

Nakayama et al.

[11] Patent Number: 4,894,254

[45] Date of Patent: Jan. 16, 1990

[54] METHOD OF FORMING SILICONE FILM

[75] Inventors: Muneo Nakayama, Tokyo; Akira Hashimoto, Kanagawa; Toshihiro Nishimura, Kanagawa; Akira Uehara, Kanagawa; Isamu Hijikata, Kanagawa, all of Japan

[73] Assignee: Tokyo Ohka Kogyo Co., Ltd., Kanagawa, Japan

[21] Appl. No.: 272,083

[22] Filed: Nov. 16, 1988

[30] Foreign Application Priority Data

Nov. 17, 1987 [JP] Japan ................................ 62-290308

[51] Int. Cl.⁴ ............................................. B05D 3/06
[52] U.S. Cl. ................................... 427/38; 427/379; 427/299; 118/620; 118/715; 118/728
[58] Field of Search ................... 427/38, 379; 118/715, 118/728, 620

[56] References Cited

U.S. PATENT DOCUMENTS 4,741,919  3/1988  Takasaki .................. 427/38
4,756,977  7/1988  Haluska et al. ........... 427/38
4,792,378  12/1988  Rose et al. ................ 427/38

Primary Examiner—Stanley Silverman
Attorney, Agent, or Firm—Irving M. Weiner; Joseph P. Carrier; Pamela S. Burt

[57] ABSTRACT

A silicone film is formed by drying a solution coated on a substrate at a temperature below 150° C. to form a silicone film on the substrate, treating the silicone film in an oxygen plasma, and heating the silicone film treated in the plasma at a temperature of 150° C. or higher.

22 Claims, 2 Drawing Sheets

METHOD OF FORMING SILICONE FILM

BACKGROUND OF THE INVENTION

1. Field of the Invention

The present invention relates to a method of forming a film, and more particularly to a method of forming a silicone film for use as an interlayer insulation film of a semiconductor device such as of VLSI (Very Large Scale Integration).

2. Description of the Relevant Art

Silicone films which are excellent in insulation, heat resistance, and stability are employed, for example, as orientation films in liquid crystal display devices and as interlayer insulation films of electronic devices such as semiconductors of VLSI. One process which is widely recently used to form such a silicone film is a "coating method" capable of forming a silicone film of relatively high quality in simple operation. According to the coating method, a coating solution for forming a silicone film is coated on a substrate up to a prescribed thickness, and thereafter heated normally at a temperature of 300° C or higher, thus forming a silicone film.

Where a photoresist, or a film formed by CVD or PVD, or another film is directly coated on a silicone film which has been produced by the coating method, the silicone film and the film formed thereon do not sufficiently adhere to each other. To avoid this drawback, before another film is applied to a silicone film, the surface of the silicone film is ground into a rough surface by sandpaper, or the surface of the silicone film is activated by being exposed to a corona discharge or ultraviolet radiation. However, this process of forming a silicone film having a sufficient adhering ability is complex and results in a high cost.

According to Japanese Laid-Open Patent Publication No. 57-111046, the adhesion capability of a silicone film is improved by depositing a layer of $SiO_2$ or $Al_2O_3$ on a film of polysilsesquioxane which is one type of silicone. However, since the step of depositing the layer of $SiO_2$ or $Al_2O_3$ is required, the overall process of forming a desired silicone film is not simplified and reduced in cost.

The present invention has been made in an effort to effectively solve the aforesaid problems of the conventional methods of forming a silicone film suitable for having another film formed thereon.

SUMMARY OF THE INVENTION

It is an object of the present invention to provide a method of forming a silicone film of high adhesion capability through a reduced number of steps.

To achieve the above object, there is provided according to the present invention a method of forming a silicone film, comprising the steps of coating a solution for forming a silicone film on a substrate and drying the coated solution at a temperature below 150° C. to form a silicone film on the substrate, treating the silicone film in a plasma produced from a gas mainly composed of oxygen, and heating the plasma silicone film at a temperature of at least 150° C.

The above and further objects, details and advantages of the present invention will become apparent from the following detailed description of preferred embodiments thereof, when read in conjunction with the accompanying drawing.

DETAILED DESCRIPTION OF THE PREFERRED EMBODIMENTS

Figure 1:
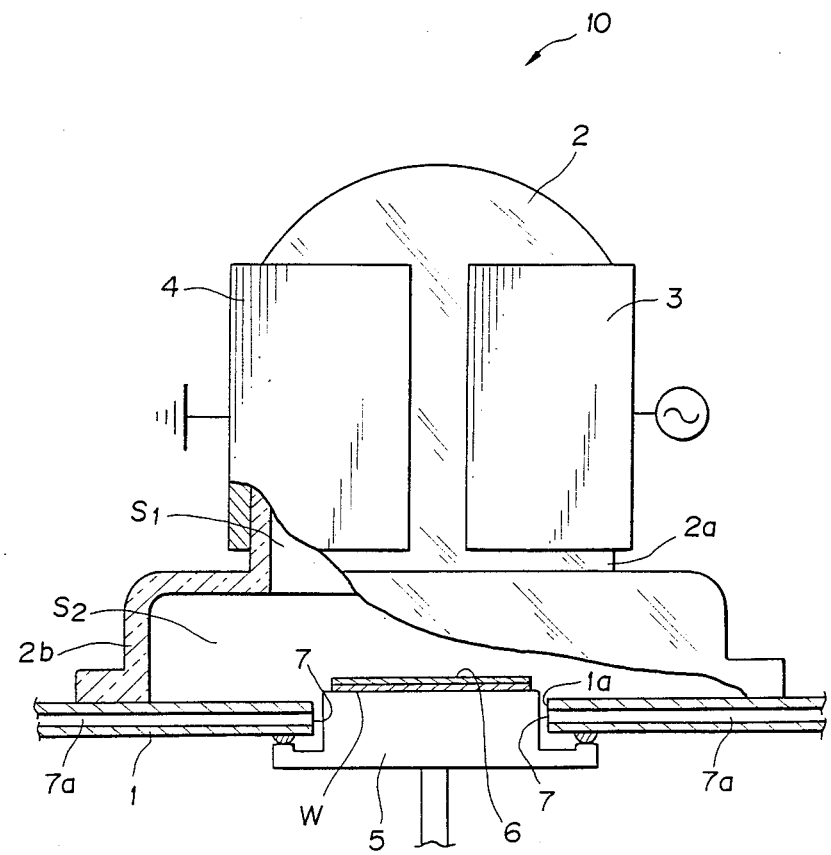
FIG. 1 is a schematic side elevational view, partly in cross section, of an induction-type plasma treatment apparatus employed for forming a silicone film according to a method of the present invention.

In FIG. 1, the reference numeral 10 generally indicates an induction-type plasma reaction treatment apparatus used in the second step of a method of forming a silicone film according to the present invention. The treatment apparatus 10 comprises a bottom plate 1, a bell-jar-type chamber member 2 fixedly mounted on the bottom plate 1, and a pair of semicylindrical electrodes 3, 4 disposed in mutually confronting relation on an upper portion 2a of the chamber member 2. The electrode 3 is connected to a high-frequency power supply, whereas the other electrode 4 is grounded. The bottom plate 1 has a central opening 1a in which a vertically movable table 5 is hermetically inserted. The table 5 supports thereon a substrate W such as a semiconductor wafer which faces into a reaction treatment space S2 defined in a lower portion 2b of the chamber member 2. The bottom plate 1 has a plurality of evacuating discharge holes 7 opening at the edge of the opening 1a toward the outer peripheral surface of the table 5, i.e., near the outer peripheral edge of the substrate W. The discharge holes 7 are equally angularly spaced around the table 5 and held in communication with a vacuum source (not shown) through respective passages 7a defined in the bottom plate 1. The upper portion 2a of the chamber member 2, and the electrodes 3, 4 jointly constitute a plasma generator, and the lower portion 2b, the bottom plate 1, the table 5, and the discharge holes 7 jointly constitute a reaction treatment assembly. The plasma generator 2a, 3, 4 is positioned upwardly of and in communication with the reaction treatment assembly 2b, 1, 5, 7. The plasma generator 2a, 3, 4 is in the shape of a bell jar and positioned directly above the substrate W which is to be treated. The electrodes 3, 4, when energized, produces a plasma in a space S1 defined in the upper portion 2a of the chamber member 2. The substrate W is treated by plasma reaction in the space S2 in the lower portion 2b. Inasmuch as the plasma generating space S1 is disposed above the reaction treatment space S2 in communication therewith, the plasma generated in the space S1 upon evacuation through the discharge holes 7 is uniformly introduced into the lower space S2. A plasma shower is highly efficiently be applied to the substrate W particularly because the plasma generating space S1 is positioned directly above the substrate W.

The first step of the method according to the present invention is carried out in the following manner:

The first step (I): A solution for forming a silicone film is coated on the surface of the substrate W, and the coated solution is dried at a temperature below 150° C. to form a silicone film 6 on the substrate W.

The solution for forming a silicone film is basically prepared by dissolving a silane compound or a silicone resin compound suitable for forming a silicone resin into an organic solvent. The silicone resin used has Si atoms contained in at least the main chain or the side chain. More specifically, the solution may be:

(i) a solution prepared by dissolving, in an organic solvent, one or more of silicone resin compounds such as polysiloxane, polyladderorganosiloxane, polysilazane, polysilane, polysilsilane, polysilmethylene, polysilylphenylene, polyphenyleneoxysiloxane, polysilsesquioxane, poly(p-trimethylsilylstyrene), poly(trimethylvinylsilane), monophenyl.triphenylsiloxysilanediol-bisphenol; or (ii) an organosilanol solution, suitable for forming a silicone film, which is obtained by adding water to a mixture of an organic solvent and organoalkoxysilane or organohalidesilane dissolved in the organic solvent to hydrolyze the mixture; or (iii) a solution obtained by dissolving in an organic solvent a polyimide-silicone resin which is a reaction product of a mixture comprising diaminopolysiloxane, organic diamine, and tetracarbonic acid.

Practically, the solution (ii) is preferable to the other solutions (i) and (iii). Particularly, where a solution is prepared using monomethyltrimethoxysilane and tetramethoxysilane as alkoxysilane, a silicone film having a sufficient thickness and an excellent degree of uniformity can be formed. Monomethyltrimethoxysilane and tetramethoxysilane which are dissolved in an organic solvent can be hydrolyzed without any catalyst. Therefore, the solution (ii) can advantageously be used in the manufacture of semiconductor devices. It is preferable to use a mixture having a ratio of one mole of monomethyltrimethoxysilane to 0.5 through 5 moles of tetramethoxysilane.

The organic solvent used in the preparation of the solutions (i) through (iii) may be:

(A) alcohols such as methyl alcohol, ethyl alcohol, propyl alcohol, or butyl alcohol; or (B) ketones such as acetone, methyl ethyl ketone, or acetyl acetone; or (C) esters such as methyl acetate, ethyl acetate, or butyl acetate; or (D) polyhydric alcohols such as ethylene glycol, glycerin, diethylene glycol, ethylene glycol monomethyl ether, ethylene glycol monoethyl ether, ethylene glycol monobutyl ether, or propylene glycol, or their ether.

One of these solvents or a mixture of two or more of these solvents may be employed.

The solution may be coated on the substrate W by any of a spinner method, a dipping method, a spray method, a screen printing method, a roll coater method, and a brush coating method. The solution coated on the substrate W is dried in air or an inert gas at a temperature lower than 150° C. If the coated solution were dried at a temperature of 150° C. or higher, the finally formed silicone film would tend to crack.

The second step of the method is carried out as follows:

The second step (II): The surface of the silicone film 6 is treated in an oxygen plasma. More specifically, the moveable table 5 in the induction-type plasma reaction treatment apparatus 10 is elevated to place the substrate W in the reaction treatment space S2, and thereafter a gas mainly comprising oxygen is introduced into the plasma generating space S1 through the top of the chamber member 2. At the same time, the interior space in the chamber member 2 is evacuated through the discharge holes 7. Then, a voltage is applied between the electrodes 3, 4 to generate a plasma in the space S1.

The generated plasma is introduced into the reaction treatment space S2 under suction from the discharge holes 7. As a consequence, the coated film 6 on the substrate W is treated in the oxygen plasma. The plasma treatment activates the surface of the film 6 for increasing adhesion between the film 6 and another film which will subsequently be formed on the surface of the film 6.

The gas which is introduced into the spaces S1, S2 should preferably contain at least 80% by volume of oxygen. A gas to be mixed with oxygen may be a fluorine gas such as $CHF_3$, $C_2F_6$, $C_3F_8$, $C_5F_{10}$, $C_4F_8$, or the like. The silicone film 6 should preferable be treated in the oxygen plasma at a temperature of 300° C. or below, particularly in the range of from 50° C. to 200° C., for practical reasons. To keep the plasma treatment temperature in this range, a single-substrate plasma treatment apparatus for treating substrates one by one is preferable to a batch plasma treatment apparatus for simultaneously treating a plurality of substrates. The batch plasma treatment apparatus would require a relatively long plasma treatment time in which the treating temperature would increase out of the above desired temperature range. The illustrated plasma reaction treatment apparatus 10 is of the single-substrate type because it treats one substrate W at a time. Since the apparatus 10 is of the induction type, damage of the film 6 by ions and charged particles in the plasma is minimized.

After the second step (II), the substrate W is moved into a heat treatment device (not shown) in which the following third step of the present invention is carried out.

The third step (III): The film 6 is heated in air or an inert gas at a temperature of 150° C. or higher, preferably 300° C. or higher. The upper limit of the temperature is be selected so as not to adversely affect the substrate W itself, and is generally, but not necessarily, 950° C. If the temperature at which the film 6 is heated exceeded 950° C., impurities in the film 6 on the surface of the substrate W would usually be diffused in the substrate W.

The heat treatment in the third step (III) produces a final silicone film which is of high adhesion capability, free from cracks, uniform, and practical.

Certain examples of the present invention will be described below.

EXAMPLE 1

Coating solution for forming a silicone film: OCD Type-7 (manufactured by TOKYO OHKA KOGYO CO., LTD); The coating solution OCD Type-7 is obtained by dissolving a hydrolyzate of organoalkoxysilane in an organic solvent.

Coating method: Spinner method

- First step (I):
Drying conditions:
  Temperature: 140° C.
  Time: 30 minutes
Thickness of the obtained film 6: 1 μm
- Second step (II):
Induction-type plasma reaction treatment apparatus:
  TCA-2300 (manufactured by TOKYO OHKA KOGYO CO., LTD.)
Plasma treatment conditions:
  Introduced gas: Pure $O_2$ gas
  Electric power: 250 W
  Pressure: 0.8 Torr
  Temperature: 60° C.

Time: 90 seconds
●Third step (III):
Heat treatment conditions:
 Temperature: 300° C.
 Time: 30 minutes
●Results:
A crack-free, uniform silicone film was formed.

A resist pattern mask comprising a positive photoresist was formed on the silicone film, and then subjected to the following plasma etching process:
Plasma etching apparatus:
 OAPM-400 (manufactured by TOKYO OHKA KOGYO CO., LTD.)
Atmosphere: a mixture gas of $CF_4$ and $O_2$ ($CF_4:O_2=97$ vol. %:3 vol. %)
After the plasma etching process, no substantial peeling of the resist pattern mask from the silicone film was seen, and hence the silicone film was etched exactly according to the pattern of the resist pattern mask.

EXAMPLE 2

The conditions of Example 2 are the same as those of Example 1 except for the following conditions:
Coating solution for forming a silicone film: OCD Type-2 (manufactured by TOKYO OHKA KOGYO CO., LTD); The coating solution OCD Type-2 is obtained by dissolving a hydrolyzate of organohalidesilane in an organic solvent.
●Second step (II):
Plasma treatment conditions:
 Temperature: 150° C.
●Results:
A crack-free, uniform silicone film was formed.

The silicone film was subjected to the same plasma etching process as that in Example 1. After the plasma etching process, no substantial peeling of the resist pattern mask from the silicone film was seen, and hence the silicone film was etched exactly according to the pattern of the resist pattern mask.

EXAMPLE 3

The conditions of Example 3 are the same as those of Example 1 except for the following conditions:
Coating solution for forming a silicone film:
Prepared by mixing 136 g (1 mole) of monomethyltrimethoxysilane and 152 g (1 mole) of tetramethoxysilane, adding the mixture to 220 g of ethylene glycol monobutyl ether, stirring the solution, dropping 108 g of pure water to the solution over about 6 hours while stirring the solution, and then leaving the resultant solution for five days at room temperature.
●Results:
A crack-free, uniform silicone film was formed.

The silicone film was subjected to the same plasma etching process as that in Example 1. After the plasma etching process, no substantial peeling of the resist pattern mask from the silicone film was seen, and hence the silicone film was etched exactly according to the pattern of the resist pattern mask.

EXAMPLE 4

The conditions of Example 4 are the same as those of Example 1 except for the following conditions:
Coating solution for forming a silicone film:
Prepared by mixing 136 g (1 mole) of monomethyltrimethoxysilane and 456 g (3 moles) of tetramethoxysilane, adding the mixture to 354 g of butyl alcohol, stirring the solution, dropping 270 g of pure water to the solution over about 6 hours while stirring the solution, and then leaving the resultant solution for five days at room temperature.
●Results:
A crack-free, uniform silicone film was formed.

COMPARATIVE EXAMPLE

The conditions of Comparative Example are the same as those of Example 1 except the following conditions:
●First step (I):
Drying condition:
 Temperature: 180° C.
●Results:
Cracks were eventually developed in the surface of the formed silicone film. Therefore, no practically usable film was obtained.

With the present invention, as described above, a final silicone film can be formed by carrying out the following three steps:
The first step (I):
A solution for forming a silicone film is coated on the surface of the substrate W, and the coated solution is dried at a temperature below 150° C. to form a silicone film 6 on the substrate W.
The second step (II):
The surface of the silicone film 6 is treated in a plasma generated from a gas mainly comprising oxygen.
The third step (III):
The film 6 is heated in air or an inert gas at a temperature of 150° C. or higher, preferably 300° C. or higher.

In Examples 1 through 4 above, the solution coated on the substrate W is dried at a relatively low temperature into the silicone film 6. Then, the silicone film 6 is treated (i.e., activated) in a plasma using a gas mainly comprising oxygen by the induction-type plasma treatment apparatus 10, so that only the surface of the silicone film 6 is oxidized into a layer of silicon oxide. Thus, the final silicone film has an increased ability to adhere to another film such as a photoresist which will be formed on the silicone film. The internal layer of the final silicone film remains unoxidized and keeps the flexibility that the organic radial of silicone has. The finally obtained silicone film is therefore free of cracks and uniform. As a consequence, electronic components employing silicone films can be manufactured with an increased yield. The steps (I), (II), and (III) can be effected in an automatic process.

The plasma generating space S1 and the reaction treatment space S2 in the induction-type plasma treatment apparatus 10 are actually obtained by functionally dividing the single internal space in the chamber member 2 into two spaces. Therefore, the plasma treatment apparatus 10 is of a simple construction. Since the plasma generating space S1 is positioned directly above the substrate W and the evacuating discharge holes 7 are positioned near the outer circumferential surface of the table 5 on which the substrate W is placed, the generated plasma does not flow out of the apparatus, but the plasma shower is applied evenly and efficiently to the substrate W.

Figure 2:
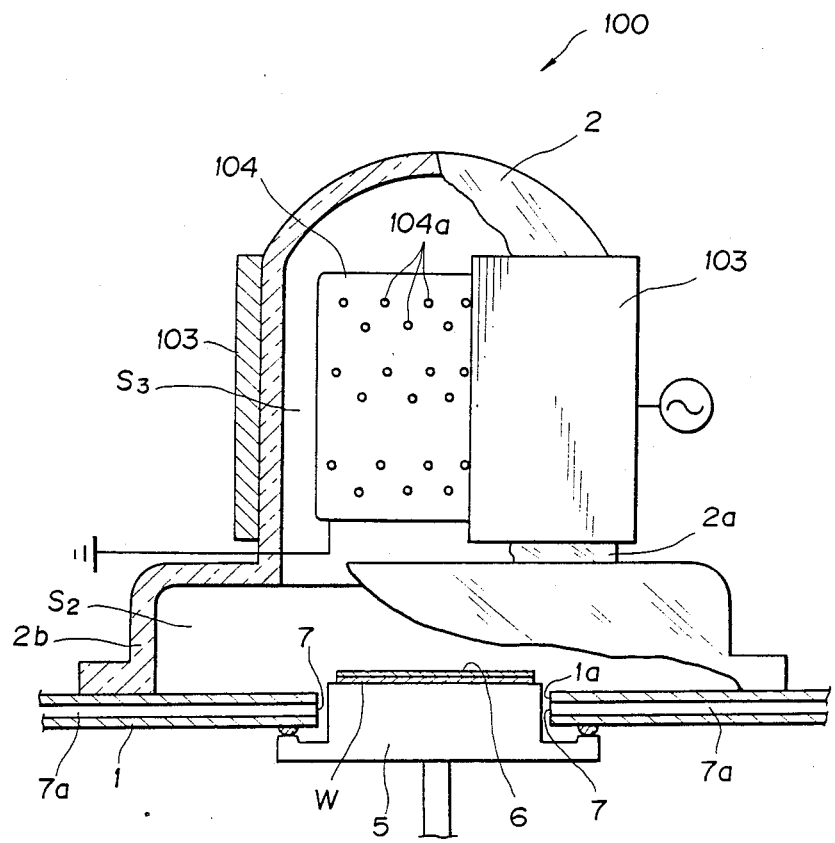
FIG. 2 is a schematic side elevational view, partly in cross section, of modified electrodes for generating a plasma.

FIG. 2 shows a plasma treatment apparatus 100 having plasma generating electrodes according to a modification of the present invention. Those parts shown in FIG. 2 which are identical to those shown in FIG. 1 are denoted by identical reference numerals, and will not be described in detail.

The plasma treatment apparatus 100 has an outer cylindrical electrode 103 fitted over a chamber member 2 and an inner cylindrical electrode 104 disposed in the chamber member 2 in concentric relation to the electrode 103. The electrode 103 is electrically connected to a high-frequency power supply, and the electrode 104 is grounded. The electrode 104 is in the form of a hollow cylinder with open upper and lower ends and has a plurality of small through holes 104a. The electrodes 103, 104 serve to generate a plasma in the apparatus 100.

A plasma is generated in an annular space S3 defined between the inner peripheral surface of the chamber member 2 and the outer peripheral surface of the inner electrode 104. Active plasma components enter through the holes 104a into a cylindrical space inside the electrode 104, and then fall as a downward plasma shower stream onto a substrate W.

The plasma generated in the annular space S3 enters and is gathered or concentrated in the cylindrical space in the electrode 104. Therefore, the plasma shower applied to the substrate W is made highly uniform to treat the substrate W highly uniformly.

The outer and inner electrodes 104, 103 may not necessarily be of a complete cylindrical form. The outer electrode 103 may for example comprise a plurality of plate electrodes disposed circumferentially around the chamber member 2 and spaced at equal angular intervals around the chamber member 2.

Although there have been described what are at present considered to be the preferred embodiments of the present invention, it will be understood that the invention may be embodied in other specific forms without departing from the essential characteristics thereof. The present embodiments, are therefore, to be considered in all aspects as illustrative, and not restrictive. The scope of the invention is indicated by the appended claims rather than by the foregoing description.

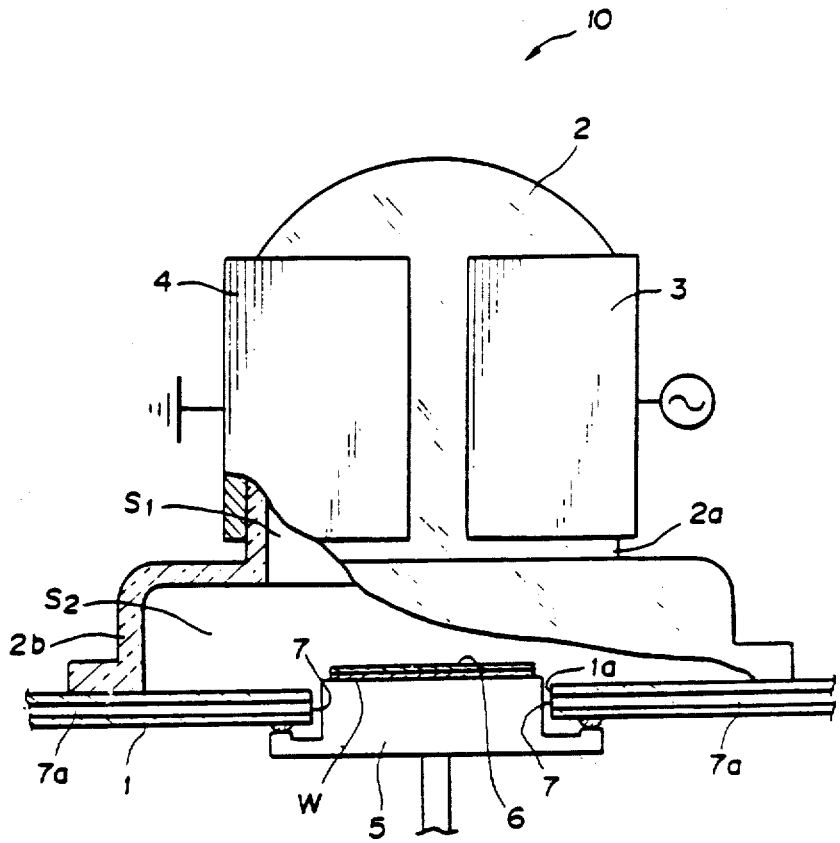

We claim:

1. A method of forming a silicone film, comprising the steps of:
   (a) coating a solution for forming a silicone film on a substrate and drying the coated solution at a temperature below 150° C. to form a silicone film on the substrate;
   (b) treating the silicone film in a plasma produced from a gas mainly composed of oxygen; and
   (c) heating the plasma treated silicone film at a temperature of at least 150° C.

2. A method according to claim 1, wherein said solution for forming a silicone film comprises an organosilanol solution prepared by dissolving at least one of organoalkoxysilane and organohalidesilane into an organic solvent and adding water to the solution to hydrolyze the latter.

3. A method according to claim 2, wherein said organosilanol solution is prepared by dissolving a hydrolyzate of organoalkoxysilane in an organic solvent.

4. A method according to claim 3, wherein said organoalkoxysilane comprises a mixture of monomethyltrimethoxysilane and tetramethoxysilane.

5. A method according to claim 4, wherein said mixture comprises a ratio of 1 mole of monomethyltrimethoxysilane to 0.5 through 5 moles of tetramethoxysilane.

6. A method according to claim 1, wherein said gas mainly composed of oxygen contains at least 80% by volume of oxygen.

7. A method according to claim 1, wherein said silicone film is treated in the plasma at a temperature ranging from 50° C. to 200° C.

8. A method according to claim 1, wherein said plasma treated silicone film is heated at a temperature of at least 300° C.

9. A method according to claim 1, wherein said silicone film is treated in the plasma by an induction-type plasma reaction treatment apparatus having a plasma generator and a reaction treatment assembly.

10. A method according to claim 9, wherein said reaction treatment assembly has a table for placing said substrate thereon and a plurality of evacuating discharge holes positioned near an outer circumferential surface of said table.

11. A method according to claim 10, wherein said discharge holes confront said outer circumferential surface of said table and are equally angularly spaced around said table.

12. A method according to claim 9, wherein said induction-type plasma reaction treatment apparatus is of a single-substrate type for treating one substrate at a time in the plasma.

13. A method according to claim 9, wherein said plasma generator is disposed upwardly of and near said reaction treatment assembly.

14. A method according to claim 9, wherein said plasma generator is in the shape of a bell jar and positioned directly above said substrate.

15. A method according to claim 9, wherein said plasma generator comprises a chamber member defining a plasma generating space therein and a pair of electrodes disposed around said chamber member.

16. A method according to claim 15, wherein one of said electrodes is connected to a high-frequency power supply and the other electrode is connected to ground.

17. A method according to claim 1, wherein said silicone film is treated in the plasma by an induction-type plasma reaction treatment apparatus;
   said plasma reaction treatment apparatus having a plasma generator and a reaction treatment assembly;
   said plasma generator comprising a first, bell-jar shaped enclosure member defining a plasma generating space therein and a pair of electrodes disposed around said first enclosure member and confronting each other, one of said electrodes being connected to a high-frequency power supply and the other electrode to ground; and
   said reaction treatment assembly comprising a second enclosure member defining therein a reaction treatment space communicating with and positioned downwardly of said plasma generating space, a support member for supporting and setting said substrate in said reaction treatment space to position said substrate directly below said plasma generating space, and evacuating discharge holes positioned near an outer circumferential edge of said substrate set in said reaction treatment space.

18. A method according to claim 1, wherein said silicone film is treated in the plasma by an induction-type plasma reaction treatment apparatus;
   said plasma reaction treatment apparatus having a plasma generator and a reaction treatment assembly; and
   said plasma generator comprising an enclosure member and a plurality of electrodes disposed outside and inside, respectively, of said enclosure member and defining a plasma generating space in said enclosure member.

19. A method according to claim 18, wherein said electrodes include an outer electrode fitted over said enclosure chamber and connected to a high-frequency power supply and an inner electrode disposed in said enclosure chamber and connected to ground.

20. A method according to claim 9, wherein said plasma generator and said reaction treatment assembly together provide an enclosed space for containing said substrate having said silicone film coated thereon during the plasma treatment step.

21. A method according to claim 9, wherein said plasma generator includes an upper portion of a chamber member and said reaction treatment assembly includes a lower portion of the chamber member.

22. A method according to claim 10, wherein said plurality of evacuating discharge holes are positioned lower than an upper surface of said table.

* * * * *

UNITED STATES PATENT AND TRADEMARK OFFICE
CERTIFICATE OF CORRECTION

PATENT NO. : 4,894,254  Page 1 of 2
DATED : JANUARY 16, 1990
INVENTOR(S) : Muneo NAKAYAMA et al It is certified that error appears in the above-identified patent and that said Letters Patent is hereby corrected as shown below:

ON TITLE PAGE: showing the illustrative figure should be deleted to appear as per attached title page.
under "References Cited", after the U.S. Patent Documents cited, insert the following:
--FOREIGN PATENT DOCUMENTS
57-111046  7/1983  Japan--.

Column 1, line 62, after "the plasma" insert --treated--.

Column 2, line 55, after "efficiently" delete "be".

Column 4, line 12, change "preferable" to --preferably--.

Column 7, line 32, change ", are" to --are,--.

Signed and Sealed this

Twenty-seventh Day of August, 1991

Attest:

HARRY F. MANBECK, JR.

Attesting Officer

Commissioner of Patents and Trademarks

United States Patent [19]

Nakayama et al.

[11] Patent Number: 4,894,254

[45] Date of Patent: Jan. 16, 1990

[54] METHOD OF FORMING SILICONE FILM

[75] Inventors: Muneo Nakayama, Tokyo; Akira Hashimoto, Kanagawa; Toshihiro Nishimura, Kanagawa; Akira Uehara, Kanagawa; Isamu Hijikata, Kanagawa, all of Japan

[73] Assignee: Tokyo Ohka Kogyo Co., Ltd., Kanagawa, Japan

[21] Appl. No.: 272,083

[22] Filed: Nov. 16, 1988

[30] Foreign Application Priority Data

Nov. 17, 1987 [JP] Japan ............................. 62-290308

[51] Int. Cl.$^4$ ............................................. B05D 3/06
[52] U.S. Cl. ...................................... 427/38; 427/379; 427/299; 118/620; 118/715; 118/728
[58] Field of Search .................. 427/38, 379; 118/715, 118/728, 620

[56] References Cited

U.S. PATENT DOCUMENTS

| 4,741,919 | 3/1988 | Takasaki | 427/38 |
| 4,756,977 | 7/1988 | Haluska et al. | 427/38 |
| 4,792,378 | 12/1988 | Rose et al. | 427/38 |

Primary Examiner—Stanley Silverman
Attorney, Agent, or Firm—Irving M. Weiner; Joseph P. Carrier; Pamela S. Burt

[57] ABSTRACT

A silicone film is formed by drying a solution coated on a substrate at a temperature below 150° C. to form a silicone film on the substrate, treating the silicone film in an oxygen plasma, and heating the silicone film treated in the plasma at a temperature of 150° C. or higher.

22 Claims, 2 Drawing Sheets